United States Patent [19]

Binder

[11] 4,127,777
[45] Nov. 28, 1978

[54] METHOD FOR AUTOMATIC ADJUSTMENT

[75] Inventor: Johann Binder, Unterpfaffenhofen, Germany

[73] Assignee: Siemens Aktiengesellschaft, Berlin & Munich, Germany

[21] Appl. No.: 815,215

[22] Filed: Jul. 13, 1977

[30] Foreign Application Priority Data

Jul. 23, 1976 [DE] Fed. Rep. of Germany ....... 2633297

[51] Int. Cl.² ............................................. G01N 21/30
[52] U.S. Cl. ..................................... 250/548; 356/400
[58] Field of Search ........... 250/548, 561, 571, 237 R, 250/237 G; 356/172

[56] References Cited

U.S. PATENT DOCUMENTS 3,867,038  2/1975  Westell ............................. 250/237 G
4,070,117  1/1978  Johannsmeier ...................... 356/172

Primary Examiner—David C. Nelms
Attorney, Agent, or Firm—Hill, Gross, Simpson, Van Santen, Steadman, Chiara & Simpson

[57] ABSTRACT

A method for adjusting the registry of a mask in relation to a substrate in a projection printing photolithographic device characterized by after obtaining the adjustment of the registry, correcting the focus of the objective of the device so that the desired surface of the substrate lies in a plane of focus of the objective. The adjusting of the focus is accomplished by displacing the objective or imaging lenses in a direction vertical to the plane of the mask and the surface of the substrate in such a manner that there results an optimum focusing of the light utilized during the adjustment process of the mask to the surface of the substrate.

9 Claims, 1 Drawing Figure

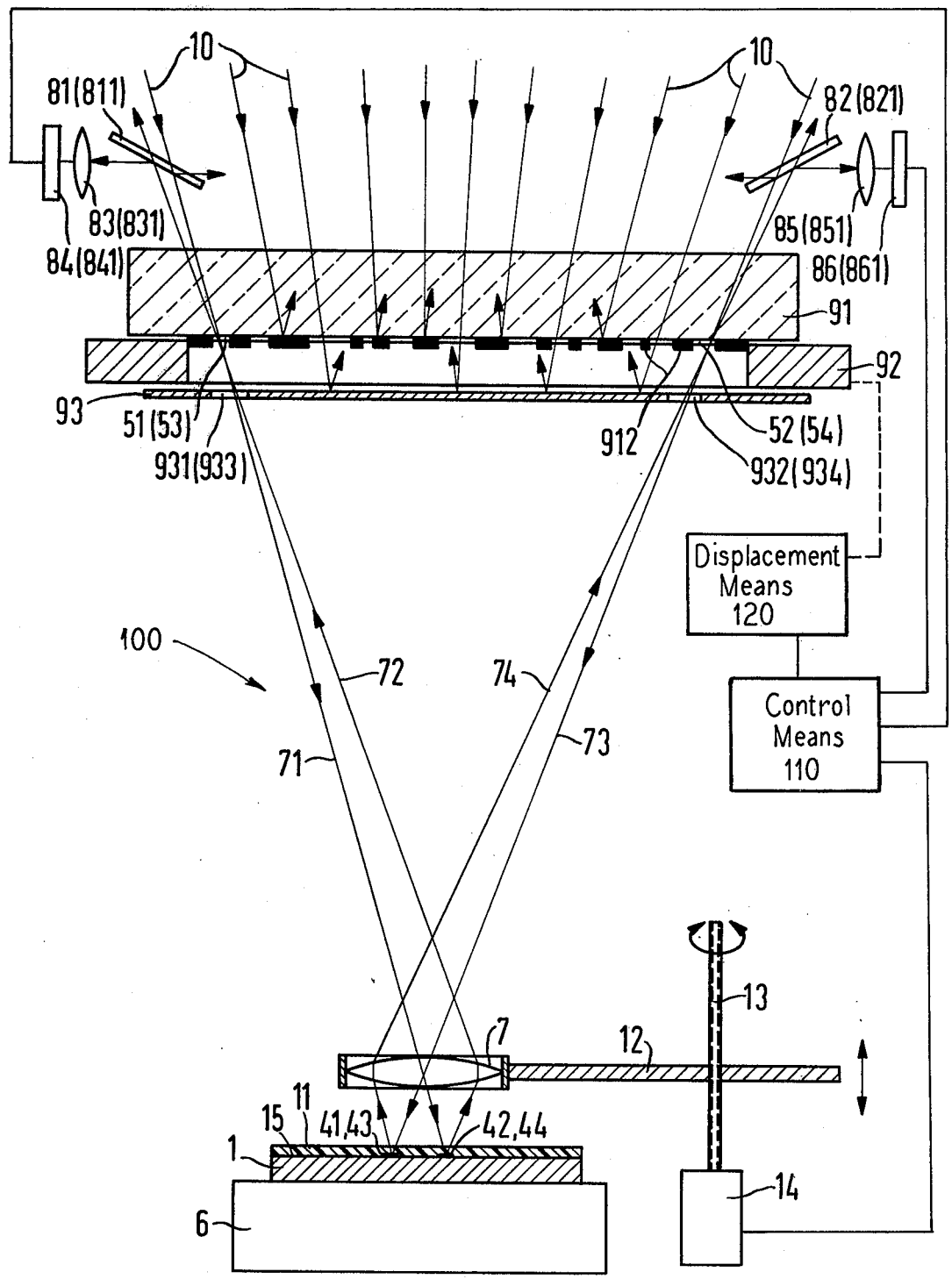

METHOD FOR AUTOMATIC ADJUSTMENT

BACKGROUND OF THE INVENTION

1. Field of the Invention

The invention relates to a process for an automatic adjustment of a layered substrate and more particularly the adjustment of a semiconductor wafer by the use of adjustment marks with an optical alignment technique. In particular, the present invention is directed to an improvement in the method disclosed and claimed in the U.S. patent application of Dietrich Widmann and Johann Binder, U.S. Ser. No. 709,129, filed July 26, 1976 whose disclosure is hereby incorporated by reference thereto.

2. Prior Art

In semiconductor technology, it is known to produce structures on a semiconductor surface by a method which includes regional or zonal exposure of a portion of the photo resist layer disposed on the semiconductor surface, development of the exposed photo resist layer, and then etching the regions of the surface no longer covered by the photo resist layer after development to produce the desired surface structure. The exposure of the regions or zones of the photo resist layer is carried out either with the aid of a contact printing process, wherein the exposure is through a photo mask (or photography mask) which is pressed onto the layer of photo resist which is carried on the suface of the semiconductor substrate or is accomplished with the aid of a projection printing process wherein a photo mask is projected on the photo resist layer by means of high resolution objective or compound lens arrangement.

With a projection printing process, the photo mask can be projected onto the photo resist layer either true to scale or in a reduced fashion. In the case of a 1:10 reduction during the projection of the photo mask, a resolution capacity of approximately 500 lines per mm and adjustment precision of $\pm$ 0.2 $\mu$m is obtained. In contrast with the contact printing process, the advantages of projection printing process particularly lie in the fact that the mask and the semiconductor disk are free of mechanical stresses and that the mask can be readily controlled as to its precision. In addition, expansions, bendings or other deformations of the semiconductor disk or substrate have only a minimal effect on the precise location of successive structural planes. However, a disadvantage does exist in that the exposure of the entire semiconductor disk having, for example, a diameter of 50 mm is very costly due to the requirement of a large mask and a very large objective or lens system.

Accordingly, it is more economical to use a mask and lens system which only exposes one portion or zone of the layer of photo resist on the semiconductor surface and then expose additional zones or regions of the photo resist after additional adjustments, focusing and exposure operations. However, this method can only be economically utilized if the adjustment, focusing and exposure can be automatically achieved in the case of a reductive projection.

In the step and repeat apparatus employed for this purpose, the distance between the objective utilized for reproduction and the surface of the photo resist layer disposed on the semiconductor disk is either mechanically adjusted or regulated to a precision of $\pm$ 0.2 $\mu$m via an air cushion. The relative position between the semiconductor disk and the objective in the direction of the optical axis is usually not changed or adjusted between each exposure of the zones of the semiconductor disk. For this reason, uneven surfaces in the semiconductor disk will produce unsharp reproductions of the image of the photo mask on the photo resist layer if these uneven locations exceed the amount of the depth of focus of the objective, which, for example, during a reduction of 1:10 constitutes $\pm$2 $\mu$m. In addition, mechanical influences and temperature changes can also cause changes in the length or longitudinal deformation which, due to the lack of a distance adjustment between the objective and the surface of the semiconductor disk, will likewise lead to an unsharp, blurred or undefined reproduction of the image of the mask. If these losses in the definition of the image, which losses are due to unsharp or blurred reproduction of the image, are to be avoided, the reproduction exposure apparatus must be focused manually before each exposure of an area or zone of the substrate.

SUMMARY OF THE INVENTION

The present invention is directed to a method which provides automatic adjustment of the registry of a mask on a substrate such as an individual semiconductor chip and includes automatic correction of the focus of the image of the masking pattern on the surface of a photo resist layer for each individual exposure of each zone of an individual semiconductor disk or substrate.

To accomplish these tasks, the present invention is directed to an improvement of the method for adjustment of the layered substrate including semiconductor wafers with a mask which comprises the steps of providing a substrate having at least two coarse or rough adjustment patterns and at least two fine adjustment patterns on a surface thereof with each of the adjustment patterns having a plurality of recesses, providing a transparent body having a mask disposed on one surface thereof, said mask having an adjustment pattern for each of the adjustment patterns on the surface of the substrate; providing a shutter having apertures at positions corresponding to the adjustment patterns of the mask to ensure that only light beams which pass through the adjustment patterns of the mask reach the surface of the substrate, directing a convergent light from a condenser through the transparent body, the mask, the apertures of the shutter to an objective which directs and focuses the light onto the surface of the substrate so that the light beams hitting or striking the surface of the substrate are reflected back through the objective, shutter apertures, and adjustment patterns on the mask with the light beams not being reflected when they hit or are received in the recesses of the adjustment patterns of the substrate, sensing the intensity of the reflected light passing through each of the adjustment patterns on the mask with photosensitive elements and adjusting the position of the transparent body with the applied mask in the plane of the mask so that the adjustment patterns of the mask are in registry with the adjustment patterns of the substrate, said step of adjusting including a coarse or rough adjustment followed by a fine adjustment with both rough and fine adjustments including rotating the mask and moving the mask along the $x$ and $y$ directions in response to the intensity of the reflected light sensed by the photosensitive elements associated with each of the adjustment patterns and until the photosensitive elements receive a minimal amount of reflected light as possible, the improvement comprising after the step of adjusting, correcting the focus of the objective by displacing the objective in a direction normal to the surface of the substrate to change the intensity of the light received by the photosensitive elements and continuing said displacement until the objective reaches a position in which the photosensitive elements receive a minimal intensity of the reflected light so that the desired surface of the substrate lies in a plane of focus of the objective.

Preferably, the step of correcting the focus includes storing the value of the intensity of light initially received at the light sensitive elements at the completion of the fine adjustment, displacing the objective in a direction to decrease the intensity of the light being received, continuing said displacement until the stored value is again obtained after passing through an intensity minimum and then displacing the objective in an opposite direction by half the amount of displacement in the first mentioned direction.

BRIEF DESCRIPTION OF THE DRAWING

The FIGURE is a cross-sectional view schematically illustrating an apparatus for performing the method of the present invention.

DESCRIPTION OF THE PREFERRED EMBODIMENT

The principles of the present invention are particularly useful in the method utilizing a projection apparatus generally indicated at 100 in the FIGURE. As illustrated, the apparatus 100 includes a table 6, which supports a substrate 1 such as a semiconductor disk. As illustrated, the substrate 1 is provided on a surface 15 with a layer 11 of a photo resist material and the surface 15 is also provided with four adjustment targets or patterns 41–44. Each of the adjustment patterns comprises a plurality of recesses and the patterns 41 and 42 are for a coarse or rough adjustment while the patterns 43 and 44 are used for a fine adjustment.

The apparatus 100 has a table or frame 92 on which a transparent member 91 is supported. On a surface of the member 91, a photo mask for use in exposing the photo resist layer 11 is provided. The mask is provided with adjustment patterns 51 and 52 which are for a coarse adjustment and adjustment patterns 53 and 54 which are for fine adjustments, which patterns 51-54 have a size determined by the amount of reduction by objective 7 and correspond to the adjustment patterns 41-44 on the substrate 1. The apparatus 100 also includes a shutter or diaphragm 93, which has apertures 931-934, which are associated with the adjustment patterns 51-54 of the mask. The diaphragm or shutter 93 will ensure that only light passing through the individual adjustment patterns 51-54 reaches the substrate 1 during the step of adjusting the registry of the mask with the adjustment patterns of the substrate. During the actual exposure of the photo resist layer 11, the shutter is removed.

When a converging beam of light 10 is projected through the transparent member 91 and the mask from a condenser, light such as beams 71 and 73, which pass through the adjustment patterns such as 51-54 will pass through the apertures of the shutter 93 and are directed or focused by the objective 7 onto the surface 15 of the substrate 1. The light reflected by the surface 15 is passed back through the objective 7 as beams 72 and 74 and then passes through the shutter and the corresponding adjustment patterns. After passing through patterns 51, 53, the light is reflected by partial mirrors 81 and 82 through lenses 83 and 85, respectively, to photosensitive elements 84 and 86. It should be noted that there is a mirror, a lens and photosensitive element associated with each of the patterns 51-54 so that for the pattern 53 there is a mirror 811, a lens 831 and an element 841 and for the pattern 54 there is a mirror 821, a lens 851 and a sensing element 861. As illustrated, the apparatus 100 is substantially the same as the apparatus disclosed in the above-mentioned U.S. application Ser. No. 709,129.

Each of the photosensitive elements such as 84 and 86 will sense the intensity of the respective reflected light beams such as 72 and 74 and create a signal based on the intensity of the light received. This signal is received by a control means indicated by a box 110 which controls means 120 for displacing the frame 92 and mask in a plane of the mask. As pointed out in the above-mentioned U.S. application, a coarse or rough adjustment is accomplishd by shifting the frame 92 with the mask and transparent member 91 attached therewith along an x direction either in +x or −x until a minimum intensity is sensed by each of the elements 84 and 86. In the next step, the frame 92 is rotated until the elements 84 and 86 sense the same value. After completing the rotation, the frame is moved in the y direction which is perpendicular to the x direction either in +y or −y until each of the sensing elements such as 84 and 86 sense a minimum value. As mentioned hereinabove, the means for moving and rotating is generally indicated by a box 120 and the specific arrangement of motors for accomplishing these movements are disclosed in the above-mentioned U.S. application.

After accomplishing the coarse or rough adjustment, a fine adjustment is accomplished by utilizing the patterns 53 and 54 along with the patterns 43 and 44 on the surface 15 of the substrate 1. As in the previous rough adjustment, light reflected through the patterns 53 and 54 is received by the mirrors 811 and 821, respectively, and directed by lenses 831 and 851 to the respective elements 841 and 861. The control means 110 causes means 120 for displacing the frame 92 to move the frame in the x direction until a minimum intensity is received by the photosensitive elements 841 and 861, to rotate the frame until both elements sense the same value, and then to move in a y direction until both elements have a minimum value.

After making the fine adjustment, the adjustment patterns of the mask are in registry with the adjustment patterns on the workpiece or substrate 1.

As illustrated, the apparatus 100 includes a support 12 for the objective 7 which is illustrated as being a single lens. The support 12 along with the lens 7 can be moved vertically or perpendicularly to the surface 15 of the substrate 1 by a spindle drive mechanism 13 which is driven by a servo motor 14. To ensure that the correct focus has been obtained, the objective 7 together with the support 12 is moved or displaced upwardly from the surface 15 in the direction of the transparent member 91. If, during this process, detectors such as 84 and 86 determine an increase in the light intensity impinging on the detectors, the rotational direction of the servo motor 14 is reversed and the lens is moved in a reversed direction toward the substrate 1. In case of this method, advantage is taken of the fact that the fraction limiting objective lens employed in these systems have the property that the intensity of lines reproduced by these lenses changes by the same amount in front of and behind the focal plane for the same amount of displacement from the focal plane.

During this step of correcting focusing, preferably the intensity which was registered by the sensing elements such as 84 and 86 at the completion of the fine adjustment is stored in the control means 110. Thus, during displacement of the lens 7, it is displaced through a distance creating the minimum intensity back to a value which is the same as the stored value. When the stored value is reached the lens 7 will be in a position which is a mirror inverted relation to the focal plane as the initial position. Accordingly, after the initial intensity which was stored in the control means 110 is obtained, the movement of lens 7 is arrested and the servo motor 14 is switched to a reverse movement so that the lens will be displaced in the opposite direction for amount of displacement, which is one-half of the original displacement. After accomplishing this, the lens 7 will be in a nominal position so that the focal plane of the lens lies on the surface 15 of the workpiece or substrate 1.

Basically, the adjustment process just described may also be carried out in the opposite manner wherein for the purpose of focusing, advantage is taken of the fact that the intensity of the bright lines is at a maximum in the case of an optimum focusing. The method employed for this purpose is equivalent to the method just described wherein a complementary master pattern is used as the adjustment structure and the adjustment proceeds until a maximum intensity is obtained. However, in general, adjustment proceeding at a minimum intensity, which is known as a zero method, is more precise and easier to carry it out.

As disclosed in above-mentioned U.S. patent, the recesses forming each of the adjustment patterns at least have sloping side edges. If the substrate is a silicon disk, then each of the recesses of the adjustment patterns on the substrate will have a pyramid-shaped etching structure and these recesses are produced by means of an anisotropic etching of the surfaces of the substrate. In other materials, the recesses of adjustment patterns on the surface of the substrate are produced by etching each of the recesses of the surface of the substrate to a depth of approximately 2 $\mu$m. Subsequently, to obtain the desired slope angles for the edges of the recesses, ion etching by bombarding with ions or atoms is utilized.

It should also be noted that a light used during registration of the mask with the substrate is preferably selected at a wavelength which will insignificantly photo-mechanically convert the photo resist disposed on the surface of the substrate. For example, green light is utilized during the adjustment process.

Although various minor modifications may be suggested by those skilled in the art, it should be understood that I wish to embody within the scope of the patent warranted hereon, all such modifications as reasonably and properly come within the scope of my contribution to the art.

I claim:

1. In a method for the automatic adjustment of a layered substrate including semiconductor wafers with a mask comprising the steps of providing a substrate having at least two adjustment patterns for a coarse adjustment and at least two patterns for a fine adjustment on a surface thereof with each of the adjustment patterns having a plurality of recesses; providing a transparent body having a mask disposed on one surface thereof, said mask having an adjustment pattern for each of the adjustment patterns on the surface of the substrate; providing a shutter having apertures at positions corresponding to the adjustment patterns of the mask to ensure that only light beams which pass through the adjustment patterns of the mask reach the surface of the substrate; directing convergent light from a condenser through the transparent body, the mask, the shutter, to an objective which directs the light onto the surface of the substrate so that light beams hitting the surfaces of the substrate are reflected back through the objective, shutter apertures and adjustment patterns on the mask with the light beams not being reflected when they hit said recesses of the adjustment pattern on the substrate, sensing the intensity of the reflected light passing through each of the adjustment patterns on the mask with photosensitive elements, and adjusting the position of the transparent body with the applied mask in the plane of the mask so that the adjustment patterns of the mask are in registry with the adjustment patterns of the substrate, said step of adjusting including a coarse adjustment followed by a fine adjustment with both coarse and fine adjustments including rotating the mask and moving the mask in $x$ and $y$ directions in response to the intensity of the reflected light sensed by photosensitive elements associated with each adjustment pattern and until the photosensitive elements receive a minimal amount of reflected light as possible, the improvements comprising after the step of adjusting, correcting the focus of the objective by displacing the objective in a direction normal to the surface of the substrate to change the intensity of the light received by the photosensitive elements and continuing said displacement until the objective reaches a position at which the photosensitive elements receive a minimal intensity of the reflected light so that the desired surface of the substrate lies in a plane of focus of the objective.

2. In a method according to claim 1, wherein the step of correcting the focus includes storing the value of the intensity of light initially received by the light sensitive elements at the completion of the fine adjustment, displacing the objective in a direction to decrease the intensity of the light being received, continuing said displacement until the stored value is again obtained after passing through an intensity minimum and then displacing the objective in the opposite direction by half the amount of displacement in the first mentioned direction.

3. In a method according to claim 1, wherein the step of coarse adjustment includes an initial adjustment with the adjustment patterns of the mask partially overlapping the adjustment patterns on the surface of the substrate, displacing the mask along the $x$ direction until both light sensitive elements associated with coarse adjustment patterns register a minimum for the intensity of the light reflected from the workpiece, subsequently rotating the mask until both coarse light sensitive elements indicate the same value, and then displacing the mask in the $y$ direction until both coarse light sensitive elements indicate a minimum intensity.

4. In a method according to claim 1, wherein the adjustment pattern of the mask for each of the fine adjustment patterns on the substrate have a light passing aperture for each recess of the fine adjustment pattern of the surface of the substrate and light absorbing material lying between each of the apertures, and wherein during the fine adjustment, the mask and transparent member is displaced along the $x$ direction until the two photosensitive elements associated with the fine adjustment patterns register a minimum amount of reflected radiation, the member is then rotated until both of said fine adjustment light sensitive elements indicate the same value, and then the member is displaced along the y direction until both fine adjustment light sensitive elements indicate a minimum intensity.

5. In a method according to claim 1, wherein for the purposes of the coarse adjustment, the adjustment patterns applied on the mask are determined by the reproduction scale of the objective and correspond to the coarse adjustment pattern on the substrate.

6. In a method according to claim 1, wherein during the coarse adjustment, green light is utilized which green light only insignificantly photomechanically converts a photo resist disposed on the surface of the substrate.

7. In a method according to claim 1, wherein the substrate is a silicon disk and wherein each of the recesses of the adjustment patterns on said substrate have a pyramid-shaped etching structure, said recesses being produced by means of anisotropic etching of the surface of the substrate.

8. In a method according to claim 1, wherein the step of providing recesses of the adjustment patterns on the surface comprises etching each of the recesses into a surface of the substrate to a depth of approximately 2 $\mu$m, subsequently ion etching by bombarding with ions to obtain the desired slope angles for the edges of each recess.

9. In a method according to claim 1, wherein the step of sensing the reflected light passing through the mask includes reflecting the reflected light by transparent mirrors through lenses to the respective photosensitive element.

* * * * *